(12) United States Patent
Sakamoto

(10) Patent No.: US 7,883,765 B2
(45) Date of Patent: Feb. 8, 2011

(54) MULTILAYER CERAMIC SUBSTRATE, METHOD FOR PRODUCING SAME, AND ELECTRONIC COMPONENT

(75) Inventor: Sadaaki Sakamoto, Koka (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 12/212,708

(22) Filed: Sep. 18, 2008

(65) Prior Publication Data

US 2009/0011249 A1 Jan. 8, 2009

Related U.S. Application Data

(63) Continuation of application No. PCT/JP2007/061069, filed on May 31, 2007.

(30) Foreign Application Priority Data

Jun. 2, 2006 (JP) .............................. 2006-154257

(51) Int. Cl.
*B32B 7/00* (2006.01)
(52) U.S. Cl. ...................... 428/210; 428/689; 428/697; 428/699; 428/701; 428/702
(58) Field of Classification Search ............... 428/195.1, 428/201, 209, 210, 426, 428, 432, 689, 697, 428/699, 701, 702, 901
See application file for complete search history.

(56) References Cited

U.S. PATENT DOCUMENTS

| 5,955,938 | A | 9/1999 | Fukaya |
| 6,228,196 | B1 | 5/2001 | Sakamoto et al. |
| 6,447,888 | B2 | 9/2002 | Suzuki et al. |
| 2002/0048666 | A1 | 4/2002 | Sakamoto |
| 2003/0113554 | A1 | 6/2003 | Umayahara et al. |
| 2005/0194085 | A1 | 9/2005 | Oga et al. |
| 2007/0287012 | A1* | 12/2007 | Kawai et al. ................. 428/427 |

FOREIGN PATENT DOCUMENTS

| JP | 63-109050 A | 5/1988 |
| JP | 04-364945 A | 12/1992 |
| JP | 05-178659 A | 7/1993 |
| JP | 06-029664 A | 2/1994 |
| JP | 07-291738 A | 11/1995 |
| JP | 09-237972 A | 9/1997 |
| JP | 2000-340716 A | 12/2000 |
| JP | 2007-073728 A | 3/2007 |

OTHER PUBLICATIONS

Official Communication issued in International Patent Application No. PCT/JP2007/061069, mailed on Aug. 14, 2007.
Official Communication issued in the corresponding European Patent Application No. 07744477.6, mailed on Jul. 29, 2009.

* cited by examiner

*Primary Examiner*—Gwendolyn Blackwell
(74) *Attorney, Agent, or Firm*—Keating & Bennett, LLP

(57) ABSTRACT

A multilayer ceramic substrate having high transverse strength, minimized warpage, and no delamination, has a laminated structure including an inner layer portion and surface layer portions, in which the thermal expansion coefficient of the surface layer portions is lower than the thermal expansion coefficient of the inner layer portion, the difference in thermal expansion coefficient between the surface layer portions and the inner layer portion is about 1.0 ppmK$^{-1}$ or more, and the weight content of a component common to both a material constituting the surface layer portions and a material constituting the inner layer portion is about 75% by weight or more.

7 Claims, 1 Drawing Sheet

MULTILAYER CERAMIC SUBSTRATE, METHOD FOR PRODUCING SAME, AND ELECTRONIC COMPONENT

BACKGROUND OF THE INVENTION

1. Field of the Invention

The present invention relates to a multilayer ceramic substrate, a method for producing a multilayer ceramic substrate, and an electronic component including a multilayer ceramic substrate. In particular, the present invention relates to an improvement in the strength of a multilayer ceramic substrate.

2. Description of the Related Art

A multilayer ceramic substrate in the related art is described in, for example, Japanese Unexamined Patent Application Publication No. 6-29664. Japanese Unexamined Patent Application Publication No. 6-29664 discloses a low-temperature co-fired multilayer ceramic substrate including glass and a crystalline material, in which the outermost layers have a thermal expansion coefficient less than the inner layers, and in which the total thickness of the outermost layers arranged on both sides of the substrate is less than the thicknesses of the inner layers. Japanese Unexamined Patent Application Publication No. 6-29664 discloses that the use of such a structure generates compressive stresses in the outermost layers during a cooling step after firing, thereby improving the transverse strength of the multilayer ceramic substrate.

However, the multilayer ceramic substrate described in Japanese Unexamined Patent Application Publication No. 6-29664 has the problems described below.

Simply increasing the thermal expansion coefficient between the outermost layers and the inner layers may increase the stress at the interfaces between the outermost layers and the inner layers, which can cause defects, such as delamination and voids, for example, at the interfaces. Japanese Unexamined Patent Application Publication No. 6-29664 discloses an example in which the difference in thermal expansion coefficient is about 0.4 ppmK$^{-1}$ and an example in which the difference in thermal expansion coefficient is about 0.6 ppmK$^{-1}$. The combination of the composition and the difference in thermal expansion coefficient in each example provides the effect claimed in Japanese Unexamined Patent Application Publication No. 6-29664. However, Japanese Unexamined Patent Application Publication No. 6-29664 fails to disclose any limitations on the difference in thermal expansion coefficient.

When using the structure described in Japanese Unexamined Patent Application Publication No. 6-29664, an increase in the difference in thermal expansion coefficient results in an increase in the stress at the interfaces between the outermost layers and the inner layers. If the bonding strength is insufficient at the interfaces, defects such as delamination and voids, for example, due to the stress may occur at the interfaces.

For a multilayer ceramic substrate, a smaller amount of curvature is preferable because the steps of mounting a component on the substrate and mounting the substrate on a motherboard can be performed with increased reliability. Where a component is mounted on or a resin coating is performed on a surface of the multilayer ceramic substrate, the shrinkage of solder, an adhesive, or the coating resin disadvantageously may cause warpage of the multilayer ceramic substrate. A comparison of the difference in thermal expansion coefficient between the outermost layers and the inner layers in the examples described in Japanese Unexamined Patent Application Publication No. 6-29664 and the case in which a difference is not provided shows no significant differences.

SUMMARY OF THE INVENTION

To overcome the problems described above, preferred embodiments of the present invention provide a multilayer ceramic substrate having increased strength and reduced warpage, a method for producing the multilayer ceramic substrate, and an electronic component including the multilayer ceramic substrate.

Preferred embodiments of the present invention are directed to a multilayer ceramic substrate having surface layer portions and an inner layer portion. To overcome the problems described, the thermal expansion coefficient of the surface layer portions is less than the thermal expansion coefficient of the inner layer portion, the difference in thermal expansion coefficient between the surface layer portions and the inner layer portion is at least about 1.0 ppmK$^{-1}$, and the content of a component common to a material from which the surface layer portions is made and a material from which the inner layer portion is made is at least about 75% by weight.

The difference in thermal expansion coefficient between the inner layer portion and the surface layer portions is preferably about 4.3 ppmK$^{-1}$ or less, for example.

Preferably, a material from which the surface layer portions are made includes glass including $SiO_2$ and MO (wherein MO represents at least one selected from CaO, MgO, SrO, and BaO), the ratio of $SiO_2$ to MO is in the range of about 23:7 to about 17:13, for example, a material from which the inner layer portion is made includes glass including $SiO_2$ and MO, and the ratio of $SiO_2$ to MO is in the range of about 19:11 to about 11:19, for example.

More preferably, the glass included in the material from which the surface layer portions are made has a $SiO_2$ content of about 34% to about 73% by weight, for example, and the glass included in the material from which the inner layer portion is made has a $SiO_2$ content of about 22% to about 60% by weight, by weight.

More preferably, the glass included in the material from which the surface layer portions are made includes about 34% to about 73% by weight of $SiO_2$, about 14% to about 41% by weight of MO, about 0% to about 30% by weight of $B_2O_3$, and about 0% to about 30% by weight of $Al_2O_3$, and the glass included in the material from which the inner layer portion is made includes about 22% to about 60% by weight of $SiO_2$, about 22% to about 60% by weight of MO, about 0% to about 20% by weight of $B_2O_3$, and about 0% to about 30% by weight of $Al_2O_3$, for example.

More preferably, the material from which the surface layer portions is made includes about 30% to about 60% by weight of $Al_2O_3$, for example, which functions as a filler, and the material from which the inner layer portion is made includes about 40% to about 70% by weight of $Al_2O_3$, for example, which functions as a filler.

In the method for producing the multilayer ceramic substrate according to a preferred embodiment of the present invention, surface ceramic green sheets to form surface layers, an inner ceramic green sheet to form an inner layer, and a restraint ceramic green sheet to restrain shrinkage, the restraint ceramic green sheet including an inorganic material that is not sintered at a temperature at which the surface ceramic green sheets and the inner ceramic green sheet are sintered are prepared.

A step of forming a composite laminate is performed by arranging at least one of the surface ceramic green sheets on at least one main surfaces of the at least one inner ceramic green sheet such that the at least one inner ceramic green sheet is arranged between the surface ceramic green sheets in the stacking direction to form a stack and arranging the at least one restraint ceramic green sheet on the outside of the resulting stack.

The composite laminate is fired at a temperature at which the surface ceramic green sheets and the inner ceramic green sheet are sintered but the restraint ceramic green sheet is not sintered to form a fired composite laminate in which the thermal expansion coefficient of surface layer portions defined by the surface ceramic green sheets is less than the thermal expansion coefficient of an inner layer portion defined by the inner ceramic green sheet, the difference in thermal expansion coefficient between the surface layer portions and the inner layer portion is at least about 1.0 ppmK$^{-1}$, and the weight content of a component common to both a material from which the surface layer portions is made and a material from which the inner layer portion is made is at least about 75%.

A portion defined by the restraint ceramic green sheet attached to the fired composite laminate is removed from the fired composite laminate.

Furthermore, preferred embodiments of the present invention are directed to an electronic component including the multilayer ceramic substrate described above.

In the multilayer ceramic substrate according to preferred embodiments of the present invention, the thermal expansion coefficient of the surface layer portions is less than the thermal expansion coefficient of the inner layer portion, to generate compressive stresses in the surface layer portions during a cooling step after the firing and to improve the transverse strength of the multilayer ceramic substrate in a similar manner as in Japanese Unexamined Patent Application Publication No. 6-29664.

In addition, in the multilayer ceramic substrate according to preferred embodiments of the present invention, the difference in thermal expansion coefficient between the surface layer portion and the inner layer portion is at least about 1.0 ppmK$^{-1}$, in order to suppress or prevent warpage. It is believed that the reason for this is that warpage is corrected because an in-plane stress causing warpage of the multilayer ceramic substrate is less than the stresses acting on the front and back surfaces in the planar direction attributed to a large difference in thermal expansion coefficient of at least about 1.0 ppmK$^{-1}$.

Furthermore, in the multilayer ceramic substrate according to preferred embodiments of the present invention, the weight content of a component common to both a material from which the surface layer portions is made and a material from which the inner layer potion is provided is at least about 75% by weight, thus providing sufficient bonding strength between the surface layer portions and the inner layer portion. As described above, therefore, even with a large difference in thermal expansion coefficient between the surface layer portions and the inner layer portion of at least about 1.0 ppmK$^{-1}$, for example, defects, such as delamination and voids, are prevented from occurring.

In the multilayer ceramic substrate according to preferred embodiments of the present invention, a difference in thermal expansion coefficient between the surface layer portions and the inner layer portion of about 4.3 ppmK$^{-1}$ or less, for example, prevents defects, such as delamination and voids, caused by the difference in thermal expansion coefficient.

In the method for producing a multilayer ceramic substrate according to preferred embodiments of the present invention, a composite laminate provided with the restraint ceramic green sheet on each of the main surface of the composite laminate is fired. This suppresses or prevents the shrinkage of the surface ceramic green sheets and the inner ceramic green sheet in the direction of the main surface during the firing. As a result, undesired deformations of the multilayer ceramic substrate are prevented so as to improve the dimensional accuracy of the multilayer ceramic substrate. Furthermore, the delamination between the inner layer portion and the surface layer portions is much less likely to occur during the firing.

Other features, elements, steps, characteristics and advantages of the present invention will become more apparent from the following detailed description of preferred embodiments of the present invention with reference to the attached drawings

DETAILED DESCRIPTION OF PREFERRED EMBODIMENTS

Figure 1:
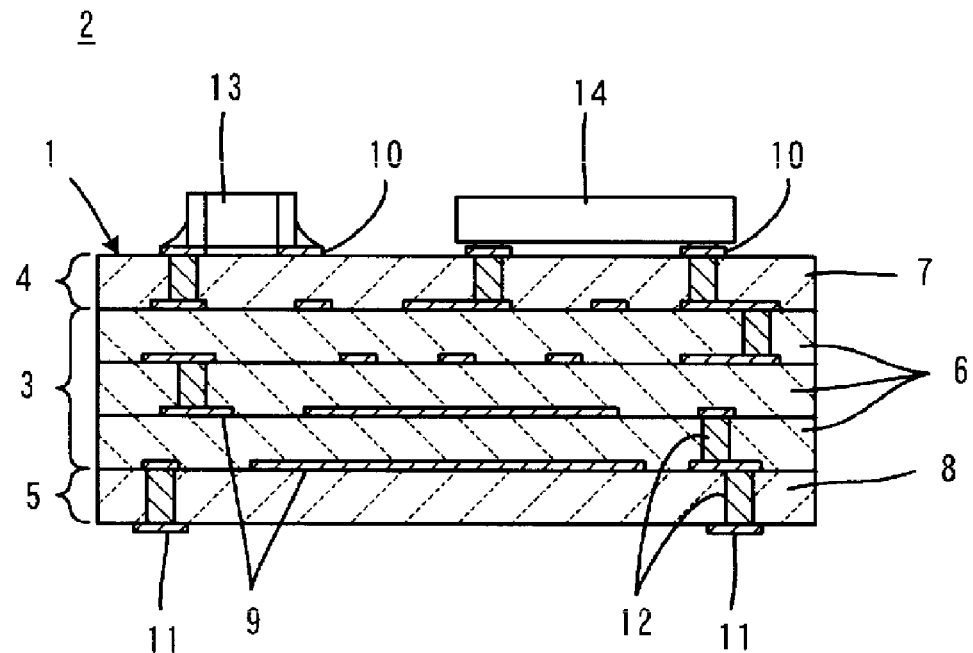
FIG. 1 is a front elevation view of an electronic component including a multilayer ceramic substrate according to a preferred embodiment of the present invention.

FIG. 1 is a front elevation view of an electronic component 2 including a multilayer ceramic substrate 1 according to a preferred embodiment of the present invention.

The multilayer ceramic substrate 1 includes a laminated structure including an inner layer portion 3, a first surface layer portion 4, and a second surface layer portion 5, the inner layer portion 3 being arranged between the first and second surface layer portions 4 and 5. The inner layer portion 3 includes at least one inner ceramic layer 6 in the inner layer portion. The first surface layer portion 4 includes at least one surface ceramic layer 7 in the surface layer portion. The second surface layer portion 5 includes at least one surface ceramic layer 8 in the surface layer portion.

The multilayer ceramic substrate 1 includes wiring conductors. The wiring conductors are arranged so as to define a passive element, for example, a capacitor or an inductor, or to establish an interconnection such as an electrical connection, between elements. Typically, the wiring conductors are defined by several conductive films 9 to 11 and several via-hole conductors 12 as shown in FIG. 1.

The conductive film 9 is arranged inside the multilayer ceramic substrate 1. The conductive film 10 is arranged on one main surface of the multilayer ceramic substrate 1. The conductive film 11 is arranged on the other main surface of the multilayer ceramic substrate 1. Each of the via-hole conductors 12 is arranged so as to be electrically connected to at least one of the corresponding conductive films 9 to 11 and passes through a corresponding one of the ceramic layers 6 to 8 in the thickness direction.

Chip components 13 and 14 are mounted on one main surface of the multilayer ceramic substrate 1, the chip components 13 and 14 being electrically connected to external conductive films 10. Thereby, the electronic component 2 including the multilayer ceramic substrate 1 is provided. External conductive films 11 are arranged on the other main surface of the multilayer ceramic substrate 1 and define electrical connections used to mount the electronic component 2 on a motherboard (not shown), for example.

In the multilayer ceramic substrate 1, the thermal expansion coefficient of the surface layer portions 4 and 5 is less than the thermal expansion coefficient of the inner layer portion 3, and the difference in thermal expansion coefficient between the inner layer portion 3 and the surface layer portions 4 and 5 is preferably at least about 1.0 ppmK$^{-1}$. The content of a component common to both a material from which the inner layer portion 3 is made and a material from which the surface layer portions 4 and 5 is made is preferably at least about 75% by weight, for example.

The use of such a structure provides a high transverse strength to the multilayer ceramic substrate 1, which effectively prevents warpage of the multilayer ceramic substrate 1 and prevents defects, such as delamination and voids, for example, from occurring at interfaces between the inner layer portion 3 and the surface layer portions 4 and 5.

In particular, with respect to warpage, it was discovered that by using a method of applying an in-plane compressive stress to each of the surface layer portions 4 and 5 according to preferred embodiments of the present invention, a difference in thermal expansion coefficient between the inner layer portion 3 and the surface layer portions 4 and 5 of at least about 1.0 ppmK$^{-1}$ significantly reduces warpage of the multilayer ceramic substrate 1. That is, the relationship between the amount of curvature and the difference in thermal expansion coefficient is as follows: a difference in thermal expansion coefficient of less than about 1.0 ppmK$^{-1}$ produces a substantially constant amount of curvature; at a difference in thermal expansion coefficient at about 1.0 ppmK$^{-1}$, the amount of curvature is significantly changed to approximately zero; and a difference in thermal expansion coefficient of greater than about 1.0 ppmK$^{-1}$ results in a substantially constant amount of curvature. It is believed that the reason for these results is that warpage is corrected because an in-plane stress causing warpage of the multilayer ceramic substrate 1 is less than the stresses acting on the front and back surfaces in the planar direction attributed to the difference in thermal expansion coefficient.

Where a component is mounted on or a resin coating is performed on a surface of the multilayer ceramic substrate 1, the shrinkage of solder, an adhesive, or the coating resin, for example, disadvantageously causes warpage of the multilayer ceramic substrate 1. To overcome this problem, by using the method for applying an in-plane compressive stress to each of the surface layer portions 4 and 5, it was discovered that a difference in thermal expansion coefficient between the inner layer portion 3 and the surface layer portions 4 and 5 of about 1.0 ppmK$^{-1}$ or more significantly reduces warpage of the multilayer ceramic substrate 1. That is, the relationship between the amount of curvature and the difference in thermal expansion coefficient was found as follows: at a difference in thermal expansion coefficient of less than about 1.0 ppmK$^{-1}$, the amount of curvature decreases with increasing difference in thermal expansion coefficient; and a difference in thermal expansion coefficient of about 1.0 ppmK$^{-1}$ or more results in a substantially constant amount of curvature. Also, it is speculated that warpage is corrected due to the fact that an in-plane stress causing warpage of the multilayer ceramic substrate 1 is relatively lower than the stresses acting on the surface layer portions in the planar direction attributed to the difference in thermal expansion coefficient.

The difference in thermal expansion coefficient between the inner layer portion 3 and the surface layer portions 4 and 5 is preferably about 4.3 ppmK$^{-1}$ or less. This value ensures the prevention of defects, such as delamination and voids, for example, at the interfaces between the inner layer portion 3 and the surface layer portions 4 and 5 due to the difference in thermal expansion coefficient.

Preferably, a material from which the surface layer portions 4 and 5 is made includes glass including $SiO_2$ and MO (wherein MO represents at least one selected from CaO, MgO, SrO, and BaO), the ratio of $SiO_2$ to MO being in the range of about 23:7 to about 17:13, for example. Preferably, a material from which the inner layer portion 3 includes glass including $SiO_2$ and MO, the ratio of $SiO_2$ to MO being in the range of about 19:11 to about 11:19, for example.

More preferably, glass included in the material from which the surface layer portions 4 and 5 are made has a $SiO_2$ content of about 34% to about 73% by weight, for example, and glass included in the material from which the inner layer portion 3 is made has a $SiO_2$ content of about 22% to about 60% by weight, for example.

The foregoing preferred compositions and contents are achieve a difference in thermal expansion coefficient between the inner layer portion 3 and the surface layer portions 4 and 5 of at least about 1.0 ppmK$^{-1}$ and a common component content of at least about 75% by weight using a borosilicate glass-based material.

The $SiO_2$ component in glass tends to reduce the thermal expansion coefficient. The MO component tends to increase the thermal expansion coefficient.

Including an appropriate amount of glass that is crystallized during firing is advantageous to obtain good mechanical strength properties. Thus, the glass composition is preferably similar to the composition of crystallized glass. For example, with a $SiO_2$—MO—$Al_2O_3$—$B_2O_3$-based glass, $MAl_2Si_2O_8$ and $MSiO_3$ are readily crystallized. Thus, the ratio of $SiO_2$ to MO is preferably adjusted such that the glass has a composition similar to the crystal composition. Accordingly, the ratio of $SiO_2$ to MO in the glass composition of the surface layer portions 4 and 5 is preferably approximately 2, for example, in order to reduce the thermal expansion coefficient. The ratio of $SiO_2$ to MO in the glass composition of the inner layer portion 3 is preferably approximately 1, for example, in order to increase the thermal expansion coefficient.

The proportion of MO in the glass composition of the inner layer portion 3 is greater than that of the surface layer portions 4 and 5, such that the inner layer portion 3 is more susceptible to erosion during a plating treatment after firing. However, the inner layer portion 3 is not exposed to the outside, and thus, is not significantly damaged during the plating treatment.

For the purpose of increasing the difference in thermal expansion coefficient, an excessively high content of $SiO_2$ in the glass included in the surface layer portions 4 and 5 causes insufficient sintering due to an inadequately reduced glass viscosity. An excessively high content of MO results in an insufficient difference in thermal expansion coefficient.

Furthermore, for the purpose of increasing the difference in thermal expansion coefficient, an excessively high content of MO in the glass in the inner layer portion 3 causes insulation failure due to a reduction in resistance to moisture. An excessively high content of $SiO_2$ results in an insufficient difference in thermal expansion coefficient.

Accordingly, the ratio of $SiO_2$ to MO in the glass included in each of the inner layer portion 3 and the surface layer portions 4 and 5 is preferably in the range described above, for example.

More preferably, the glass included in the material from which the surface layer portions 4 and 5 are made includes about 34% to about 73% by weight of $SiO_2$, about 14% to about 41% by weight of MO, about 0% to about 30% by weight of $B_2O_3$, and about 0% to about 30% by weight of $Al_2O_3$, for example, and glass included in the material from which the inner layer portion 3 is made includes about 22% to about 60% by weight of $SiO_2$, about 22% to about 60% by weight of MO, about 0% to about 20% by weight of $B_2O_3$, and about 0% to about 30% by weight of $Al_2O_3$, for example.

$B_2O_3$ provides an appropriate viscosity to glass such that sintering proceeds smoothly during firing. An excessively high content of $B_2O_3$ results in excessive baking due to an excessively low viscosity, thereby forming pores on the surface, which causes insulation failure. An excessively low content of $B_2O_3$ results in an excessively high viscosity, which causes insulation failure.

$Al_2O_3$ functions as a component defining the crystallized phase in the surface layer portions 4 and 5. When the $Al_2O_3$ content is excessively high or low, the crystallization does not easily occur.

$Al_2O_3$ improves the chemical stability of glass so as to improve the resistance to plating and moisture in the inner layer portion 3 having a relatively large MO content. $Al_2O_3$ makes an intermediate contribution between $SiO_2$ and MO to the thermal expansion coefficient. Thus, an excessively high content of $Al_2O_3$ reduces the difference in thermal expansion coefficient.

The material from which the surface layer portions 4 and 5 are made more preferably includes about 30% to about 60% by weight of $Al_2O_3$, for example. The material from which the inner layer portion 3 is made more preferably includes about 40% to about 70% by weight of $Al_2O_3$, for example.

An $Al_2O_3$ filler improves mechanical strength. An excessively low content of the $Al_2O_3$ filler results in insufficient strength. When the inner layer portion 3 subjected to a tensile stress does not have sufficient mechanical strength, damage occurs in the inner layer portion 3. That is, the effect of the surface layer portions 4 and 5 reinforced by the compressive stresses is not sufficiently provided. Thus, the inner layer portion 3 has an $Al_2O_3$ filler content greater than that of the surface layer portions 4 and 5 so as to have increased strength, such that the inner layer portion 3 can withstand a greater difference in thermal expansion coefficient. Therefore, the effect of the reinforced surface layer portions 4 and 5 is sufficiently provided.

The $Al_2O_3$ filler provides an intermediate contribution between glass in the inner layer portion 3 and glass in the surface layer portions 4 and 5 to the thermal expansion coefficient. Thus, an excessively high content of the $Al_2O_3$ filler reduces the difference in thermal expansion coefficient.

Examples of the filler include other suitable ceramic materials, such as $ZrO_2$, in addition to $Al_2O_3$.

In the multilayer ceramic substrate 1, each of the surface layer portions 4 and 5 preferably has a thickness of about 5 μm to about 150 μm, for example.

Stresses arising from the difference in thermal expansion coefficient act on the interfaces of the inner layer portion 3 and the surface layer portions 4 and 5. More specifically, compressive stresses act on the surface layer portions 4 and 5. Each compressive stress decreases as the distance from a corresponding one of the interfaces increases. Meanwhile, a tensile stress acts on the inner layer portion 3. The tensile stress decreases as the distance from a corresponding one of the interfaces increases. This is because the stresses are relieved as the distance increases. At a distance greater than about 150 μm, substantially no compressive stress acts on the surface. Thus, each of the surface layer portions 4 and 5 preferably has a thickness of about 150 μm or less for example.

Where each of the surface layer portions 4 and 5 has a thickness of less than about 5 μm, the inner layer portion 3 having reduced strength due to the tensile stress is located in the vicinity of a surface, i.e., located less than about 5 μm from the surface. Thus, damage is likely to occur in the inner layer portion 3 in the vicinity of the surface. That is, the effect of the surface layer portions 4 and 5 that reinforced by the compressive stresses is not provided. Thus, each of the surface layer portions 4 and 5 preferably has a thickness of at least about 5 μm, for example.

The foregoing multilayer ceramic substrate 1 is preferably produced as described below.

Figure 2:
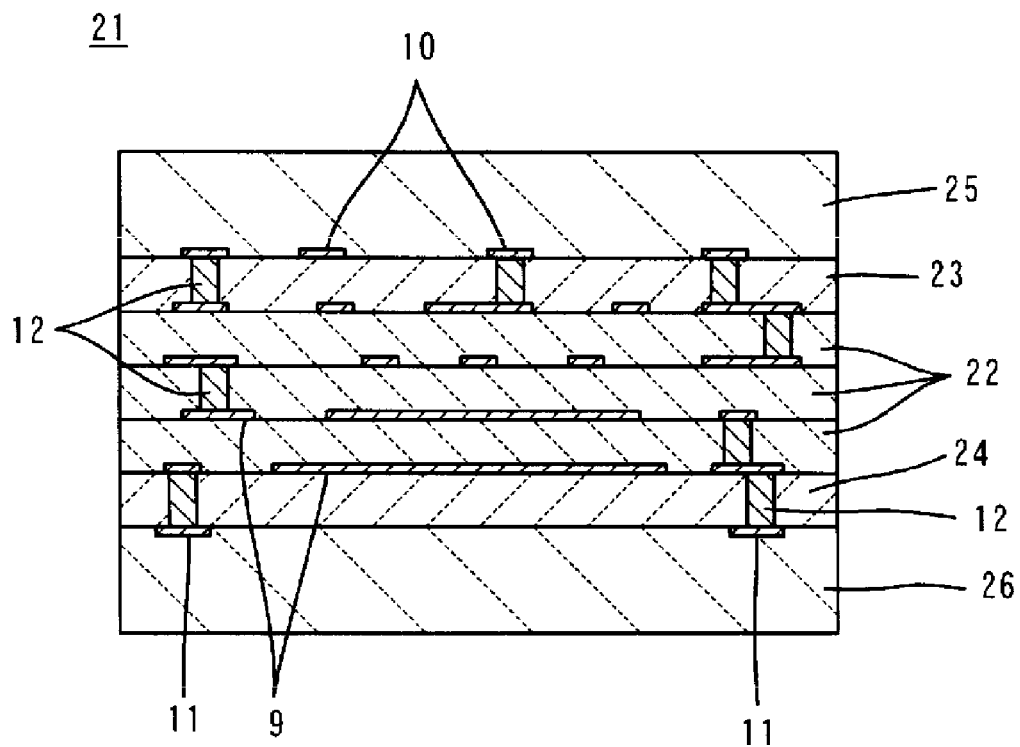
FIG. 2 is a cross-sectional view of a composite laminate prepared during the production of the multilayer ceramic substrate shown in FIG. 1.

FIG. 2 is a cross-sectional view of a composite laminate 21 prepared in the course of the production of the multilayer ceramic substrate 1. The composite laminate 21 includes inner ceramic green sheets 22 defining the inner ceramic layers 6 in the multilayer ceramic substrate 1, a surface ceramic green sheet 23 defining the surface ceramic layer 7, a surface ceramic green sheet 24 defining the surface ceramic layer 8, and restraint ceramic green sheets 25 and 26 to prevent shrinkage. Furthermore, the conductive films 9 to 11 and the via-hole conductors 12 defining wiring conductors to be arranged in the multilayer ceramic substrate 1 are arranged so as to correspond to the inner ceramic green sheets 22 and the surface ceramic green sheets 23 and 24.

To produce the composite laminate 21, the inner ceramic green sheets 22, the surface ceramic green sheets 23 and 24, and the restraint ceramic green sheets 25 and 26 are prepared. Compositions of these green sheets 22 to 24 are determined such that the thermal expansion coefficient of sintered bodies formed by the surface ceramic green sheets 23 and 24 is less than the thermal expansion coefficient of sintered bodies formed by the inner ceramic green sheets 22, the difference in thermal expansion coefficient between the sintered bodies formed by the surface ceramic green sheets 23 and 24 and the sintered bodies formed by the inner ceramic green sheets 22 is at least about $1.0$ $ppmK^{-1}$, and the weight content of a component common to both a material defining the sintered bodies formed by the surface ceramic green sheets 23 and 24 and a material defining the sintered bodies from the inner ceramic green sheets 22 is at least about 75% by weight. The restraint ceramic green sheets 25 and 26 have a composition containing an inorganic material that is not sintered at a temperature at which the surface ceramic green sheets 23 and 24 and the inner ceramic green sheets 22 are sintered.

At least one the inner ceramic green sheets 22 are arranged between the surface ceramic green sheets 23 and 24 in the stacking direction to form a stack. Furthermore, the restraint ceramic green sheets 25 and 26 are arranged outside the resulting stack, thereby forming the composite laminate 21 shown in FIG. 2.

The composite laminate 21 is fired at a temperature at which the surface ceramic green sheets 23 and 24 and the inner ceramic green sheets 22 are sintered but at which the restraint ceramic green sheets 25 and 26 are not sintered. Thereby, the fired composite laminate 21 is obtained in which the thermal expansion coefficient of the surface layer portions 4 and 5 (see FIG. 1) resulting from the surface ceramic green sheets 23 and 24 is less than the thermal expansion coefficient of the inner layer portion 3 (see FIG. 1) resulting from the inner ceramic green sheets 22, the difference in thermal expansion coefficient between the inner layer portion 3 and the surface layer portions 4 and 5 is at least about $1.0$ $ppmK^{-1}$, and the weight content of a component common to both a material defining the surface layer portions 4 and 5 and a material defining the inner layer portion 3 is at least about 75% by weight, for example.

The restraint ceramic green sheets 25 and 26 of the composite laminate 21 are removed to produce the multilayer ceramic substrate 1.

Additionally, in the production of the multilayer ceramic substrate 1, the restraint ceramic green sheets 25 and 26 need not necessarily be used. A laminate without such restraint ceramic green sheets may be fired.

Experimental examples performed to verify the advantages of preferred embodiments of the present invention will be described below.

Experimental Example 1

Surface ceramic green sheets and inner ceramic green sheets were prepared.

Table 1 shows the contents of a ceramic powder (in this experimental example, an $Al_2O_3$ powder was used) that functions as a filler and the compositions and the contents of glass powders in the surface ceramic green sheets. Table 2 shows the contents of a ceramic powder (an $Al_2O_3$ powder) that functions as a filler and the compositions and the contents of glass powders in the inner ceramic green sheets.

TABLE 1

| | Ceramic green sheet for forming surface layer | | | | | | | | |
|---|---|---|---|---|---|---|---|---|---|
| | Ceramic | Glass powder | | | | | | | |
| Sample | powder | $SiO_2$ | $B_2O_3$ | CaO | MgO | ZnO | $Al_2O_3$ | $TiO_2$ | $SiO_2$:MO |
| 1 | 50 | 45 | 5 | 0 | 40 | 10 | 0 | 0 | 15.9:14.1 |
| 2 | 30 | 30 | 10 | 0 | 20 | 30 | 0 | 10 | 18.0:12.0 |
| 3 | 60 | 38 | 20 | 22 | 0 | 10 | 5 | 5 | 19.0:11.0 |
| 4 | 40 | 60 | 5 | 15 | 20 | 0 | 0 | 0 | 18.9:11.1 |
| 5 | 20 | 60 | 5 | 15 | 20 | 0 | 0 | 0 | 18.9:11.1 |
| 6 | 40 | 46 | 30 | 14 | 0 | 0 | 5 | 5 | 23.0:7.0 |
| 7 | 50 | 45 | 5 | 0 | 40 | 10 | 0 | 0 | 15.9:14.1 |
| 8 | 60 | 38 | 20 | 22 | 0 | 10 | 5 | 5 | 19.0:11.0 |
| 9 | 40 | 46 | 30 | 14 | 0 | 0 | 5 | 5 | 23.0:7.0 |
| 10 | 50 | 30 | 10 | 0 | 20 | 30 | 0 | 10 | 18.0:12.0 |
| 11 | 40 | 73 | 4 | 23 | 0 | 0 | 0 | 0 | 22.8:7.2 |
| 12 | 50 | 60 | 5 | 15 | 20 | 0 | 0 | 0 | 18.9:11.1 |
| 13 | 60 | 34 | 5 | 16 | 10 | 5 | 30 | 0 | 17.0:13.0 |
| 14 | 50 | 54 | 5 | 30 | 11 | 0 | 0 | 0 | 17.1:12.9 |
| 15 | 40 | 46 | 30 | 14 | 0 | 0 | 5 | 5 | 23.0:7.0 |
| 16 | 50 | 73 | 4 | 23 | 0 | 0 | 0 | 0 | 22.8:7.2 |
| 17 | 40 | 60 | 10 | 25 | 0 | 0 | 5 | 0 | 21.2:8.8 |
| 18 | 50 | 60 | 10 | 25 | 0 | 0 | 5 | 0 | 21.2:8.8 |
| 19 | 50 | 70 | 5 | 10 | 0 | 15 | 0 | 0 | 26.3:3.8 |
| 20 | 50 | 73 | 4 | 23 | 0 | 0 | 0 | 0 | 22.8:7.2 |

TABLE 2

| | Ceramic green sheet for forming inner layer | | | | | | | | |
|---|---|---|---|---|---|---|---|---|---|
| | Ceramic | Glass powder | | | | | | | |
| Sample | powder | $SiO_2$ | $B_2O_3$ | CaO | MgO | ZnO | $Al_2O_3$ | $TiO_2$ | $SiO_2$:MO |
| 1 | 60 | 54 | 5 | 30 | 11 | 0 | 0 | 0 | 17.1:12.9 |
| 2 | 30 | 45 | 5 | 0 | 40 | 10 | 0 | 0 | 15.9:14.1 |
| 3 | 30 | 34 | 5 | 16 | 10 | 5 | 30 | 0 | 17.0:13.0 |
| 4 | 50 | 54 | 5 | 30 | 11 | 0 | 0 | 0 | 17.1:12.9 |
| 5 | 70 | 73 | 4 | 23 | 0 | 0 | 0 | 0 | 22.8:7.2 |
| 6 | 40 | 45 | 5 | 0 | 40 | 10 | 0 | 0 | 15.9:14.1 |
| 7 | 50 | 40 | 5 | 40 | 5 | 0 | 10 | 0 | 14.1:15.9 |
| 8 | 60 | 40 | 5 | 40 | 5 | 0 | 10 | 0 | 14.1:15.9 |
| 9 | 60 | 60 | 5 | 15 | 20 | 0 | 0 | 0 | 18.9:11.1 |
| 10 | 50 | 34 | 5 | 16 | 10 | 5 | 30 | 0 | 17.0:13.0 |
| 11 | 30 | 38 | 20 | 22 | 0 | 10 | 5 | 5 | 19.0:11.0 |
| 12 | 40 | 34 | 5 | 16 | 10 | 5 | 30 | 0 | 17.0:13.0 |
| 13 | 50 | 22 | 5 | 38 | 0 | 0 | 18 | 17 | 11.0:19.0 |
| 14 | 50 | 34 | 6 | 20 | 40 | 0 | 0 | 0 | 10.9:19.1 |
| 15 | 30 | 40 | 5 | 40 | 5 | 0 | 10 | 0 | 14.1:15.9 |
| 16 | 50 | 34 | 6 | 20 | 40 | 0 | 0 | 0 | 10.9:19.1 |
| 17 | 30 | 22 | 5 | 38 | 0 | 0 | 18 | 17 | 11.0:19.0 |
| 18 | 40 | 22 | 5 | 38 | 0 | 0 | 18 | 17 | 11.0:19.0 |
| 19 | 40 | 22 | 5 | 38 | 0 | 0 | 18 | 17 | 11.0:19.0 |
| 20 | 70 | 54 | 5 | 30 | 11 | 0 | 0 | 0 | 17.1:12.9 |

In Tables 1 and 2, each of the values of the contents of the ceramic powder indicates a weight content with respect to 100 parts by weight of the total amount of the ceramic powder and the glass powders. Thus, the content of the glass powders are equal to the remainder thereof. The units of contents of the glass powder components are "percent by weight". "$SiO_2$:MO" indicates the ratio of $SiO_2$ to MO (wherein although MO represents at least one selected from CaO, MgO, SrO, and BaO, in this experimental example, MO represents at least one of CaO and MgO) in the glass powders. The ratio is calculated such that the sum of the values of the ratio is 30.

To prepare the surface ceramic green sheets for samples 1 to 20 shown in Table 1 and the inner ceramic green sheets for samples 1 to 20 shown in Table 2, in each case, the ceramic powder, the glass powders, and an organic solvent were mixed. Furthermore, about 10 parts by weight of a butyral-based binder and about 1 part by weight of a plasticizer were added thereto with respect to 100 parts by weight of the total amount of the ceramic powder and the glass powders. The mixture was wet-mixed under predetermined conditions to form a slurry. The resulting slurry was formed into sheets by a doctor blade method. Thereby, the surface ceramic green sheets each having a thickness of about 50 μm and the inner ceramic green sheets each having a thickness of about 50 μm were produced.

An alumina powder and an organic solvent were mixed. Furthermore, about 10 parts by weight of a butyral-based binder, about 1 part by weight of a plasticizer, and about 1 part by weight of spherical cellulose were added thereto with respect to 100 parts by weight of the alumina powder. The mixture was wet-mixed under predetermined conditions to form a slurry. The resulting slurry was formed into sheets by a doctor blade method, thereby providing restraint ceramic green sheets each having a thickness of about 50 μm.

Each of the surface ceramic green sheets, the inner ceramic green sheets, and the restraint ceramic green sheets was cut into about 100 mm by about 100 mm squares. Then one restraint ceramic green sheet, one surface ceramic green sheet, five inner ceramic green sheets, one surface ceramic green sheet, and one restraint ceramic green sheet were stacked in that order to form a composite laminate. The composite laminate was pressed with a press machine and fired at about 870° C. for about 10 minutes. Unsintered powdery portions caused by the restraint ceramic green sheets attached on the surfaces of the composite laminate after the firing were removed with an ultrasonic cleaner, thus resulting in a multilayer sintered body.

TABLE 3

| Sample | Common component [wt %] | Thermal expansion coefficient [ppmK$^{-1}$] Surface layer (α1) | Inner layer (α2) | α2 − α1 | Delamination | Transverse strength [MPa] Surface layer | Inner layer | Substrate (before HC) | Substrate (after HC) | Warpage [μm] A | B |
|---|---|---|---|---|---|---|---|---|---|---|---|
| 1 | 78 | 6.5 | 6.7 | 0.2 | None | 250 | 250 | 260 | 260 | 350 | 1000 |
| 2 | 76 | 5.6 | 6.1 | 0.5 | None | 230 | 220 | 280 | 280 | 340 | 1000 |
| 3 | 82 | 6.5 | 7.3 | 0.8 | None | 260 | 220 | 300 | 300 | 320 | 1000 |
| 4 | 84 | 5.6 | 6.5 | 0.9 | None | 250 | 240 | 310 | 310 | 260 | 500 |
| 5 | 50 | 5.0 | 6.0 | 1.0 | Observed | 220 | 260 | — | — | — | — |
| 6 | 70 | 5.3 | 6.3 | 1.0 | None | 250 | 230 | 370 | 330 | 50 | 60 |
| 7 | 75 | 6.5 | 7.5 | 1.0 | None | 250 | 250 | 370 | 350 | 40 | 50 |
| 8 | 88 | 6.5 | 7.5 | 1.0 | None | 240 | 260 | 380 | 360 | 40 | 50 |
| 9 | 75 | 5.3 | 6.3 | 1.0 | None | 240 | 260 | 400 | 400 | 40 | 50 |
| 10 | 75 | 6.2 | 7.4 | 1.2 | None | 250 | 250 | 420 | 400 | 40 | 50 |
| 11 | 76 | 4.4 | 5.8 | 1.4 | None | 240 | 260 | 430 | 410 | 40 | 50 |
| 12 | 86 | 6.0 | 7.4 | 1.4 | None | 250 | 230 | 440 | 440 | 40 | 50 |
| 13 | 78 | 7.4 | 8.9 | 1.5 | None | 260 | 250 | 440 | 440 | 40 | 50 |
| 14 | 85 | 6.5 | 8.1 | 1.6 | None | 240 | 250 | 450 | 450 | 40 | 50 |
| 15 | 77 | 5.3 | 7.7 | 2.4 | None | 240 | 220 | 460 | 430 | 40 | 50 |
| 16 | 79 | 4.9 | 8.1 | 3.2 | None | 240 | 250 | 470 | 450 | 40 | 50 |
| 17 | 77 | 5.3 | 9.5 | 4.2 | None | 250 | 230 | 480 | 460 | 40 | 50 |
| 18 | 80 | 4.9 | 9.2 | 4.3 | None | 250 | 240 | 490 | 490 | 40 | 50 |
| 19 | 71 | 4.2 | 9.2 | 5.0 | None | 250 | 240 | 350 | 150 | 40 | 50 |
| 20 | 77 | 4.9 | 6.9 | 2.0 | None | 250 | 260 | 460 | 460 | 40 | 50 |

Table 3 shows the weight content of components common to both a material defining the surface layer portions and a material defining the inner layer portion of the multilayer sintered body, the weight content being calculated from the contents of the components shown in Tables 1 and 2.

The multilayer sintered body was evaluated with respect to the thermal expansion coefficient, delamination, transverse strength, and warpage, as shown in Table 3.

The section "Thermal expansion coefficient" shows the thermal expansion coefficients of the surface layer portions ("Surface layer (α1)") and the inner layer portions ("Inner layer (α2)"). The calculation results of α2−α1 are also shown.

Evaluation of delamination was performed by microscopic observation of a cross-section of the multilayer sintered body. A sample in which delamination was observed in at least one of 100 specimens of the sample is denoted as "Observed". A sample in which no delamination was observed was denoted as "None".

The transverse strength was measured by a three-point bending method. The measurements of the transverse strength of the surface layer portions and the inner layer portions are shown. With respect to the transverse strength of the entire multilayer sintered body, the transverse strength of the multilayer sintered body was measured before and after a heat-cycle test in the range of about −55° C. to about 125° C. was performed about 100 times. The measurements before the heat cycle test are shown in the column "Substrate (before HC)". The measurements after the heat cycle test are shown in the column "Substrate (after HC)".

The warpage of the resulting multilayer sintered body was measured and shown in the column "A". Meanwhile, where an adhesive resin, which is used to surface mount a chip component, was applied to one main surface of the multilayer sintered body, after the resin was thermally cured, the warpage was measured. The measurements are shown in the column "B".

Among samples 1 to 20 shown in Table 3, samples 7 to 18 and 20 are within the scope of the present invention. Each of the samples satisfies the requirements: the thermal expansion coefficient ($\alpha1$) of the surface layer portions is less than the thermal expansion coefficient ($\alpha2$) of the inner layer portion; the difference ($\alpha2-\alpha1$) in thermal expansion coefficients between the surface layer portions and the inner layer portion is at least about 1.0 ppmK$^{-1}$; and the weight content of a component common to both the surface layer portions and the inner layer portion is at least about 75% by weight. According to samples 7 to 18 and 20, a delamination-free multilayer ceramic substrate having high transverse strength and suppressed warpage is provided.

In each of samples 1 to 4, $\alpha2-\alpha1$ was less than about 1.0 ppmK$^{-1}$, which caused warpage of the multilayer ceramic substrate.

In sample 5, the weight content of the component common to both the surface layer portions and the inner layer portion was less than about 75% by weight. The low content of the common component caused delamination in the multilayer ceramic substrate.

In each of samples 6 and 19, the weight content of the component common to both the surface layer portions and the inner layer portion was less than about 75% by weight, thereby providing insufficient bonding strength at interfaces between the surface layer portions and the inner layer portion. This reduced the transverse strength after the heat cycle test.

Experimental Example 2

Surface ceramic green sheets defining surface layers and inner ceramic green sheets defining inner layers were prepared.

Table 4 shows the compositions and the contents of ceramic raw material powders included in the surface ceramic green sheets. Table 5 shows the compositions and the contents of ceramic raw material powders included in the inner ceramic green sheets.

TABLE 4

| | Ceramic green sheet for forming surface layer | | | | |
|---|---|---|---|---|---|
| Sample | Bi$_2$O$_3$ | MgO | CaO | Nb$_2$O$_5$ | SiO$_2$ |
| 21 | 50 | 20 | 0 | 30 | 0 |
| 22 | 50 | 15 | 5 | 30 | 0 |
| 23 | 50 | 10 | 10 | 30 | 0 |
| 24 | 50 | 8 | 12 | 30 | 0 |
| 25 | 40 | 0 | 35 | 25 | 0 |
| 26 | 40 | 10 | 25 | 25 | 0 |

TABLE 4-continued

| | Ceramic green sheet for forming surface layer | | | | |
|---|---|---|---|---|---|
| Sample | Bi$_2$O$_3$ | MgO | CaO | Nb$_2$O$_5$ | SiO$_2$ |
| 27 | 40 | 10 | 25 | 25 | 0 |
| 28 | 45 | 5 | 25 | 25 | 0 |
| 29 | 40 | 0 | 35 | 25 | 0 |
| 30 | 35 | 0 | 35 | 30 | 0 |
| 31 | 35 | 0 | 35 | 30 | 0 |

TABLE 5

| | Ceramic green sheet for forming inner layer | | | | |
|---|---|---|---|---|---|
| Sample | Bi$_2$O$_3$ | MgO | CaO | Nb$_2$O$_5$ | SiO$_2$ |
| 21 | 50 | 30 | 0 | 20 | 0 |
| 22 | 50 | 30 | 0 | 20 | 0 |
| 23 | 50 | 30 | 0 | 20 | 0 |
| 24 | 50 | 30 | 0 | 20 | 0 |
| 25 | 50 | 35 | 0 | 15 | 0 |
| 26 | 55 | 25 | 5 | 15 | 0 |
| 27 | 60 | 20 | 10 | 15 | 0 |
| 28 | 40 | 5 | 25 | 20 | 10 |
| 29 | 45 | 15 | 15 | 20 | 5 |
| 30 | 45 | 5 | 20 | 25 | 5 |
| 31 | 45 | 0 | 20 | 20 | 15 |

To prepare the surface ceramic green sheets and the inner ceramic green sheets for samples 21 to 31, the ceramic raw material powders and water were sufficiently mixed. The mixture was dried and subjected to a heat treatment at about 900° C. for about 60 minutes. After the heat treatment, an organic solvent was added thereto. Furthermore, about 10 parts by weight of a butyral-based binder and about 1 part by weight of a plasticizer were added thereto with respect to 100 parts by weight of the ceramic raw material powders. The mixture was wet-mixed under predetermined conditions to form a slurry. The resulting slurry was formed into sheets by a doctor blade method. Thereby, the surface ceramic green sheets each having a thickness of about 50 μm and the inner ceramic green sheets each having a thickness of about 50 μm were obtained.

Each of the surface ceramic green sheets and the inner ceramic green sheets was cut into about 100 mm by about 100 mm squares. Then one surface ceramic green sheet, five inner ceramic green sheets, and one surface ceramic green sheet were stacked in that order to form a composite laminate. The composite laminate was pressed with a press machine and fired at about 980° C. for about 60 minutes, thereby producing a multilayer sintered body.

The same evaluation as in Experimental Example 1 was performed on the multilayer sintered body for evaluation. Table 6 shows the results.

TABLE 6

| Sample | Common component [wt %] | Thermal expansion coefficient [ppmK$^{-1}$] | | $\alpha2-\alpha1$ | Delamination | Transverse strength [MPa] | | | | Warpage [μm] | |
|---|---|---|---|---|---|---|---|---|---|---|---|
| | | Surface layer ($\alpha1$) | Inner layer ($\alpha2$) | | | Surface layer | Inner layer | Substrate (before HC) | Substrate (after HC) | A | B |
| 21 | 90 | 10.8 | 11.0 | 0.2 | None | 180 | 180 | 280 | 280 | 400 | 1000 |
| 22 | 85 | 10.5 | 11.0 | 0.5 | None | 180 | 180 | 330 | 330 | 360 | 1000 |
| 23 | 80 | 10.2 | 11.0 | 0.8 | None | 180 | 180 | 340 | 340 | 300 | 1000 |

TABLE 6-continued

| | Common component | Thermal expansion coefficient [ppmK$^{-1}$] | | | | Transverse strength [MPa] | | | | Warpage [μm] | |
|---|---|---|---|---|---|---|---|---|---|---|---|
| Sample | [wt %] | Surface layer (α1) | Inner layer (α2) | α2 − α1 | Delamination | Surface layer | Inner layer | Substrate (before HC) | Substrate (after HC) | A | B |
| 24 | 78 | 10.1 | 11.0 | 0.9 | None | 180 | 180 | 350 | 350 | 230 | 500 |
| 25 | 55 | 9.5 | 10.5 | 1.0 | Observed | 190 | 180 | — | — | — | — |
| 26 | 70 | 9.8 | 10.8 | 1.0 | None | 190 | 180 | 370 | 220 | 60 | 80 |
| 27 | 75 | 9.8 | 10.8 | 1.0 | None | 190 | 170 | 370 | 370 | 50 | 60 |
| 28 | 90 | 10.1 | 11.1 | 1.0 | None | 180 | 210 | 370 | 370 | 50 | 60 |
| 29 | 75 | 9.5 | 11.0 | 1.5 | None | 190 | 190 | 380 | 380 | 50 | 60 |
| 30 | 80 | 8.6 | 10.6 | 2.0 | None | 190 | 190 | 400 | 400 | 50 | 60 |
| 31 | 75 | 8.6 | 12.0 | 3.4 | None | 190 | 220 | 420 | 410 | 50 | 60 |

Among samples 21 to 31 shown in Table 6, samples 27 to 31 are within the scope of the present invention. Each of Samples 27 to 31 satisfies the requirements: the thermal expansion coefficient (α1) of the surface layer portions is less than the thermal expansion coefficient (α2) of the inner layer portion; the difference (α2−α1) in thermal expansion coefficient between the surface layer portions and the inner layer portion is at least about 1.0 ppmK$^{-1}$; and the weight content of a component common to both the surface layer portions and the inner layer portion is at least about 75% by weight. According to samples 27 to 31, a delamination-free multilayer ceramic substrate having high transverse strength and suppressed warpage is provided.

In each of samples 21 to 24, α2−α1 was less than about 1.0 ppmK$^{-1}$, which caused warpage of the multilayer ceramic substrate.

In sample 25, the weight content of the component common to both the surface layer portions and the inner layer portion was less than about 75%. The low content of the common component caused the delamination in the multilayer ceramic substrate.

In sample 26, the weight content of the component common to both the surface layer portions and the inner layer portion was less than about 75% by weight, thereby reducing the transverse strength after the heat cycle test.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic substrate comprising:
    a laminated structure including at least two surface layer portions and at least one inner layer portion disposed between the at least two surface layer portions; wherein
    a thermal expansion coefficient of the at least two surface layer portions is less than a thermal expansion coefficient of the at least one inner layer portion, a difference in the thermal expansion coefficients between the at least two surface layer portions and the at least one inner layer portion is at least about 1.0 ppmK$^{-1}$;
    a first material defining the at least two surface layer portions and a second material defining the at least one inner layer portion include common components; and
    a content of the common components is at least about 75 percent by weight determined by adding a lower percent by weight value for each of the common components included in the first and second materials.

2. The multilayer ceramic substrate according to claim 1, wherein the difference in thermal expansion coefficient between the at least one inner layer portion and the at least two surface layer portions is about 4.3 ppmK$^{-1}$ or less.

3. The multilayer ceramic substrate according to claim 1, wherein
    the first material defining the at least two surface layer portions includes glass including SiO$_2$ and MO, where MO represents at least one selected from CaO, MgO, SrO, and BaO, and a ratio of SiO$_2$ to MO is in the range of about 23:7 to about 17:13; and
    the second material defining the at least one inner layer portion includes glass including SiO$_2$ and MO, and the ratio of SiO$_2$ to MO is in the range of about 19:11 to about 11:19.

4. The multilayer ceramic substrate according to claim 3, wherein
    the glass included in the first material defining the at least two surface layer portions has a SiO$_2$ content of about 34% to about 73% by weight; and
    the glass included in the second material defining the at least one inner layer portion has a SiO$_2$ content of about 22% to about 60% by weight.

5. The multilayer ceramic substrate according to claim 3, wherein
    the glass included in the first material defining the at least two surface layers includes about 34% to about 73% by weight of SiO$_2$, about 14% to about 41% by weight of MO, about 0% to about 30% by weight of B$_2$O$_3$, and about 0% to about 30% by weight of Al$_2$O$_3$; and
    the glass included in the second material defining the at least one inner layer portion includes about 22% to about 60% by weight of SiO$_2$, about 22% to about 60% by weight of MO, about 0% to about 20% by weight of B$_2$O$_3$, and about 0% to about 30% by weight of Al$_2$O$_3$.

6. The multilayer ceramic substrate according to claim 3, wherein
    the first material defining the at least two surface layer portions includes about 30% to about 60% by weight of Al$_2$O$_3$; and
    the second material defining the at least one inner layer portion includes about 40% to about 70% by weight of Al$_2$O$_3$.

7. An electronic component comprising the multilayer ceramic substrate according to claim 1.

* * * * *